(12) United States Patent
Chen et al.

(10) Patent No.: US 6,245,656 B1
(45) Date of Patent: Jun. 12, 2001

(54) METHOD FOR PRODUCING MULTI-LEVEL CONTACTS

(75) Inventors: Bi-Ling Chen, Taipei; Erik S. Jeng; Shih-Ming Chang, both of Hsinchu, all of (TW)

(73) Assignee: Vanguard International Semiconductor Corporation (TW)

( * ) Notice: Subject to any disclaimer, the term of this patent is extended or adjusted under 35 U.S.C. 154(b) by 0 days.

(21) Appl. No.: 09/435,512

(22) Filed: Nov. 8, 1999

(51) Int. Cl.$^7$ ............................................... H01L 21/4763
(52) U.S. Cl. ..................... 438/618; 438/620; 438/636; 438/700; 438/952
(58) Field of Search ................... 438/233, 636, 438/637, 620, 700, 952, 618

(56) References Cited

U.S. PATENT DOCUMENTS

| | | | |
|---|---|---|---|
| 4,758,305 | 7/1988 | Bonifield et al. | 156/643 |
| 5,355,020 | 10/1994 | Lee et al. | 257/741 |
| 5,854,124 | * 12/1998 | Lin | 438/637 |
| 6,030,541 | * 2/2000 | Adkisson et al. | 216/51 |
| 6,080,662 | * 6/2000 | Chen et al. | 438/637 |
| 6,090,674 | * 7/2000 | Hsieh et al. | 438/636 |
| 6,103,456 | * 8/2000 | Tobben et al. | 430/317 |
| 6,114,235 | * 9/2000 | Foote et al. | 438/636 |
| 6,121,098 | * 9/2000 | Strobl | 438/636 |

* cited by examiner

Primary Examiner—John F. Niebling
Assistant Examiner—Lynne A. Gurley
(74) Attorney, Agent, or Firm—Wood, Herron & Evans, L.L.P.

(57) ABSTRACT

The present invention relates to a method for overcming problems of amplified exposure light interference from shrinked devices and difficulties of photolithographic and etching process control due to multi-level contacts. The present invention combines reflective lights from multiple levels into one single light and reduces interference of reflective lights by introducing a reflective coating and an anti-reflective coating of SiON/Ti or SiON/TiN/Ti which further serve as an etching hard mask for avoiding overetching. The process windows are expanded. Semiconductor devices can be further shrunk and production yields an be improved.

8 Claims, 3 Drawing Sheets

METHOD FOR PRODUCING MULTI-LEVEL CONTACTS

BACKGROUND OF THE INVENTION

1. Field of the Invention

The present invention relates to a method for producing multi-level contacts, and more particularly, relates to a method which incorporates an anti-reflective coating (ARC) as a hard mask in production of multi-level contacts.

2. Description of the Prior Art

As integration density of integrated circuits increases, critical dimensions of devices become smaller and more demands on photolithographic and etching processes arise It is a challenge to shrink critical dimensions of devices so as to cary out flirther shrinking dimensions of next generation devices.

Near ultraviolet light or deep ultraviolet light is applied to expose and define patterns in photolithographic process and puts much influences on pattern resolution. From g-line (436 nm) and i-line (365 nm) to KrF (248 nm), light sources with decreasing wave lengths help to improve resolution and help to shrink critical dimensions of line width. However, light sources with decreasing wave lengths have narrower depths of focus and will result in poor exposure. Furthermore, swing curves of light intensity or line width versus depths of a photoresist increase in amplitudes and standing wave effects are amplified.

In producing multi-level contacts having shrunk critical dimensions, problems of light interference become even serious. Reflective light from multiple levels varies with line width and thus uniformity is deteriorated. Standing wave effects and notching even worsen the process. Furthermore, steps of etching for contacts with multiple levels are difficult to control.

In conventional methods for producing multi-level contacts, the line width of contacts varies, depending on the depths of contacts, because reflective lights from the first reflective surface travel or different distances. Light interference is more complicated. Contacts in the same exposure area may receive different exposure light intensities because the depths of contacts differ. Additionally, the shrunk dimensions of the line width increase light interference. In steps of etching and forming contacts after exposure, etching end points are hard to control since every multi-level contact has a different etching depth.

The conventional method for producing multi-level contacts is described hereinafter with reference to FIG. 1. A masking photoresist 12 is patterned on a dielectric layer 13 which is superimposed on a silicon substrate 11. In general, the dielectric layer 13 is made of a borophosphosilicate glass (BPSG), tetraethyl-orthosilicate (TEOS) or other dielectric materials. Devices which are defined respectively by an isolation layer 14, tungsten silicide 15 and polysilicon 16 are formed on the substrate 11. An incident light 17 is projected onto the dielectric layer 13 via an unmasked area and part of the light 17 arrives at the devices and then is reflected. The reflected light either exposes the photoresist 12 or interferes with the incident light 17. Standing wave effects occur and poor profiles are thus made. In the step of etching after exposure, etching end points are hard to control. If the etching step stops at a deep position, photoresist loss may occur and devices at a high level may be excessively etched and damaged. However, if the etching step stops at a less deep position, devices at a low level may have residues thereon and may have high contact resistance.

U.S. Pat. No. 4,758,305 uses multi-level photoresist, over-exposure and over-development to produce a spacer wall in the formation of contacts which can be applied for 0.8 $\mu$m to 1.25 $\mu$m patterns. Not any hard mask is required. The contacts thus formed are with one single depth. The problems of multi-level contacts are not solved or even raised. U.S. Pat. No. 5,355,020 discloses semiconductor devices having multi-level metal contacts in which planarization and anti-reflection techniques are applied. The 'multi-level' in the multi-level metal contacts refers to a multiple layer of metal lines, and the planarization and anti-reflection techniques are applied in production of metal lines.

For difficulties of control in contact hole diameters, which are caused by the multi-level contacts having contact holes of various depths, conventional methods do not provide solutions.

SUMMARY OF THE INVENTION

It is an object of the present invention to provide a method for producing multi-level contacts, which mainly focuses on solving problems of reflective lights from multiple levels.

One object of the present invention is to provide a method for producing multi-level contacts for combining reflective lights from multiple levels of reflective into one single light and for reducing interference of the reflective lights.

Another object of the present invention is to provide a method for producing multi-level contacts for preventing multi-level contacts from being overetched and photoresist loss.

A further object of the present invention is to provide a method for producing multi-level contacts for controlling dimensions of multi-level contacts and for expanding process windows and for increasing production yields. The critical dimensions of contacts can be further shrunk towards advanced process of next generation.

To overcome problems with conventional methods and to achieve the above objects, the present invention discloses a method for producing multi-level contacts, comprising the steps of: (a) providing a dielectric layer on a substrate which has a plurality of devices formed at various levels above the substrate; (b) forming a reflective coating on the dielectric layer; (c) forming an anti-reflective coating on the reflective coating; and (d) etching the dielectric layer and forming a plurality of contacts, wherein the reflective coating and the anti-reflective coating serve as etching hard masks and bottoms of the plurality of contacts respectively reach the plurality of devices.

The present invention further discloses a method for producing semiconductor devices, comprising the steps of: (a) forming a plurality of devices on a substrate; (b) forming a reflective coating of titanium compound and an anti-reflective coating of silicon oxynitiide on the substrate; and (c) etching the reflective coating and the anti-reflective coating to form a plurality of multi-level contacts on the substrate, wherein the reflective coating and the anti-reflective coating serve as etching hard masks and bottoms of the plurality of contacts respectively reach the plurality of devices.

The present invention adopts a reflective coating and an anti-reflective coating which also serve as an etching hard mask. By the introduction of the reflective coating, the reflective lights from multiple levels are reduced to those from a single level. The reflective lights from various levels can be eliminated by the incident lights which have 180° phase shift. The reflective coating and the anti-reflective coating can also serve as an etching hard mask and prevent overetching and photoresist loss during etching.

Problems of light interference and overetching can be solved by the method of the present invention and an improved profile of contacts can be obtained.

DETAILED DESCRIPTION OF THE INVENTION

In order to elimnate the reflective light interference and to effectively control etching end points, the present invention introduces a reflective coating and an anti-reflective coating which can also serve as an etching hard mask. The method of the present invention can be applied to semiconductor producing processes and, for example, to dynamic random access memory production.

In a preferred embodiment of the present invention, the reflective coating is selected from the group consisting of titanium and titanium nitride. The anti-reflective coating is silicon oxynitride.

Figure 1:
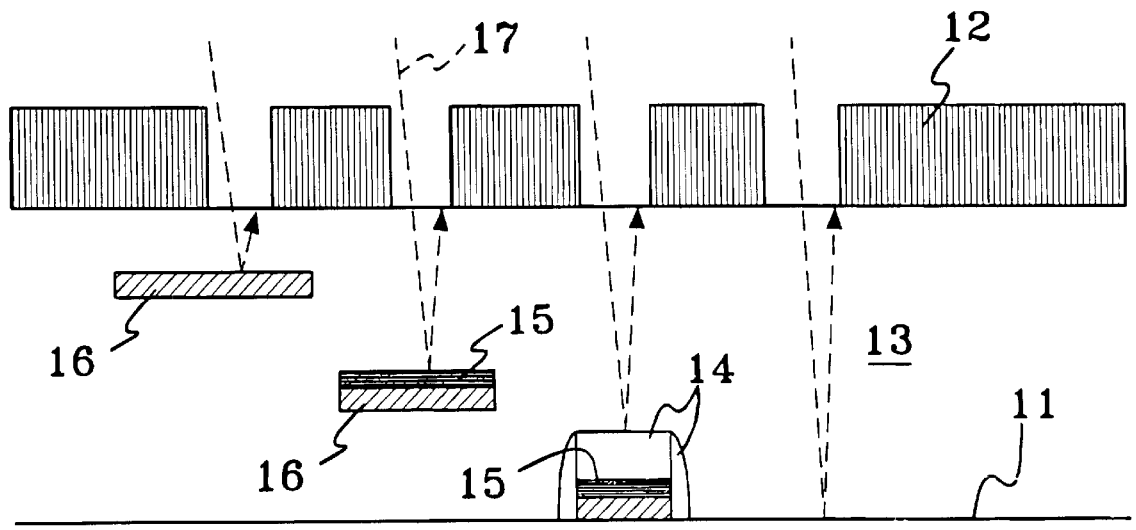
FIG. 1 depicts multi-level contacts according to a conventional method.
Figure 2:
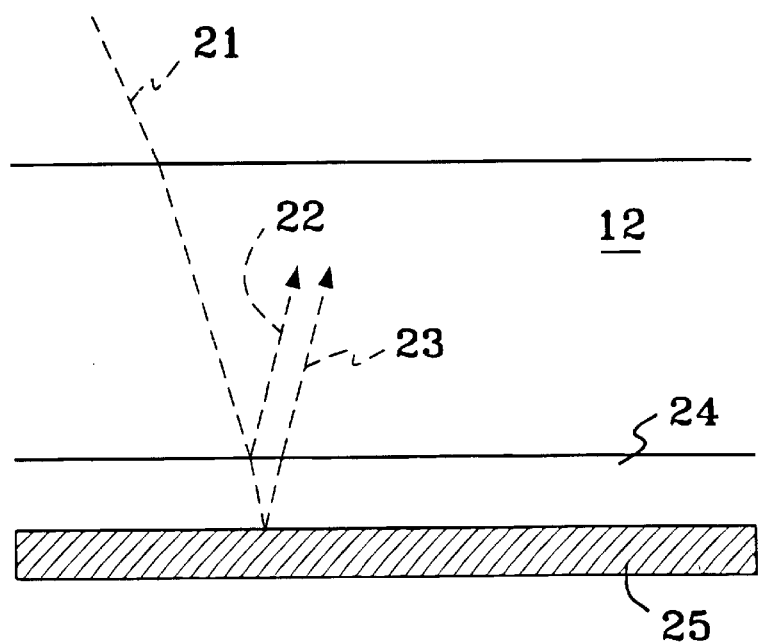
FIG. 2 depicts how to eliminate a reflective light interference by an anti-reflective coating.

The elimination of a reflective light is illustrated in FIG. 2. An incident light 21 travels at three major paths after entering a photoresist 12. One portion of the incident light 21 is absorbed by the photoresist 12 to undergo a chemical reaction, another portion of the incident light 21 is reflected by an anti-reflective coating 24 to become a first reflective light 22, and the other portion of the incident light 21 penetrates the anti-reflective coating 24 and then is reflected by a reflective layer 25 to become a second reflective light 23. By controlling the depth, refractive index and extinction coefficient of the anti-reflective coating 24, the phase shift between the second reflective light 23 and the incident light 21 or the first reflective light 22 is maintained at about a half of one wave length, i.e. 180°, and thus light cancellation occurs. The light interference can be thus eliminated.

Figure 3:
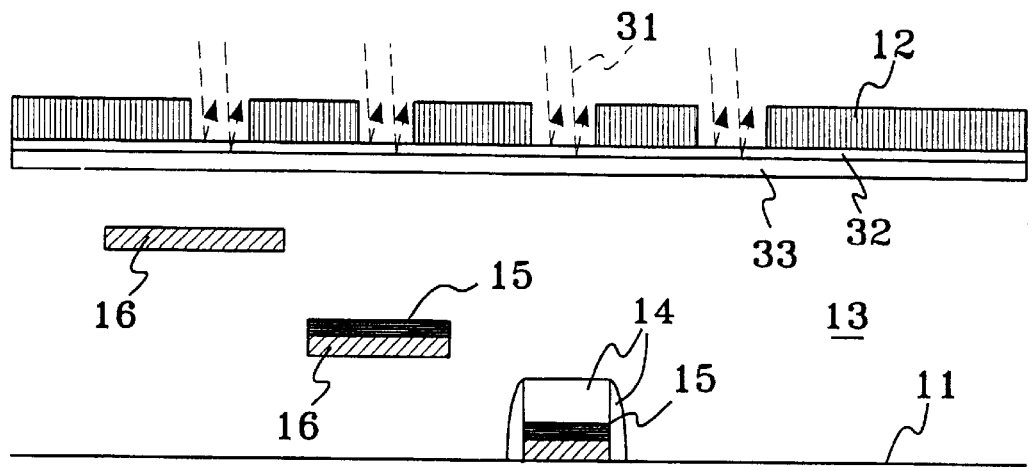
FIG. 3 depicts a reflective coating and an anti-reflective coating on a substrate.

FIG. 3 further depicts the method of the present invention in depositing a reflective coating and an anti-reflective coating on a substrate for eliminating interference of reflective light from multiple levels. First, a dielectric layer 13 is provided on a substrate 11 wherein devices are formed on various levels above the substrate 11. The devices, which are defined respectively by isolation layer 14, tungsten silicide 15 and polysilicon 16, can be any conductive components of an integrated circuit such as a gate or a bitline or a wordline as known to those familiar with the art. The dielectric layer 13 is generally made of borophosphosilicate glass (BPSG), tetraethyl-orthosilicate (TEOS) or other dielectric material such as silicon dioxide. Second, a reflective coating 33 is deposited on the dielectric layer 13. An anti-reflective coating 32 and a patterned photoresist 12 are then formed on the reflective coating 33. The patterned photoresist 12, having a multi-level contact pattern thereon, allows the incident light 31 to pass the unmasked area and to enter the anti-reflective coating 32. The reflective coating 33 reflects the incident light 31 back into the anti-reflective coating 32 such that the incident light 31 will not penetrate into the dielectric layer 13 and will not arrive at the devices on multiple levels. Reflective lights from multiple levels are integrated into that from a single level and interference of multi-level reflective light will not happen. Preferably, a first reflective light from the anti-reflective coating 32 has a phase difference of about 180° from a second reflective light. The phase difference is determined by controlling the thickness, refractive index and extinction coefficient of the anti-reflective coating 32 in accordance with the wavelength of the light.

The introduction of the reflective coating 33 and the anti-reflective coating 32 solve the problems of light interference and overetching which is caused by a step of etching for multiple levels. The anti-reflective coating 32 and the reflective coating 33, especially the reflective coating 33, can serve as etching hard masks and prevent the devices from being overetched.

Figure 4A:
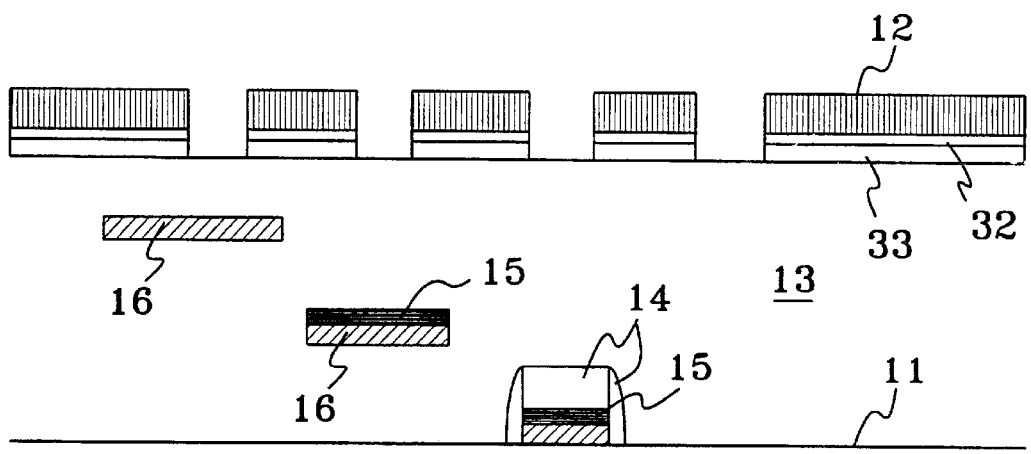
FIG. 4a to FIG. 4e depict steps of producing multi-level contacts according to an embodiment of the present invention.

An embodiment of the present invention is further described with reference to FIG. 4a to FIG. 4e. As shown in FIG. 4a, a reflective coating 33 is deposited on the dielectric layer 13. The reflective coating 33 is selected from the group consisting of titanium and titanium nitride. The selection is mainly based on the adhesion between the reflective coating and a former layer. An anti-reflective coating 32 is then deposited on the reflective coating 32 and a photoresist is patterned thereon. The anti-reflective coating 32 is selected from the group consisting of silicon oxynitride. The thickness of the anti-reflective coating is about 200 angstrom to 1000 angstrom, and preferably about 280 angstrom to 310 angstrom. Then the unmasked portions of the anti-reflective coating 32 and the reflective coating 33 are removed by 1% to 40% of $CH_4$, 1% to 20% of $CHF_3$, 1% to 50% of $BCl_3$, 1% to 30% of $CC_2$, 1% to 80% of Ar or 1% to 20% of $O_2$ chemistry etching under a pressure of 0.01 millitorr to 1.0 millitorr. The step of etching is known to persons skilled in the art.

Figure 4B:
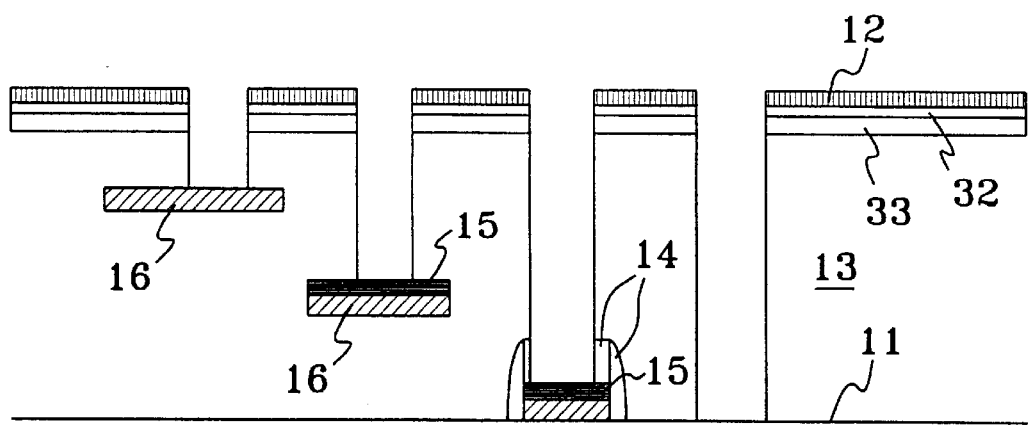

As shown in FIG. 4b, the dielectric layer 13 is then etched and a plurality of contacts are formed. In the step of etching process, the reflective coating 33 and the anti-reflective coating 32 serve as etching hard masks and bottoms of the plurality of contacts respectively reach the plurality of devices. The etching hard masks avoid etching variations caused by contact etching for multiple levels. The etching hard masks either prevent the photoresist 12 from being overetched and damage of the surface of the dielectric layer 13, or prevent from under-etching and residues on the contacts. The etching variations may even result in contact pattern errors, which can be overcome by the reflective coating and anti-reflective coating which serve as hard masks.

Figure 4C:
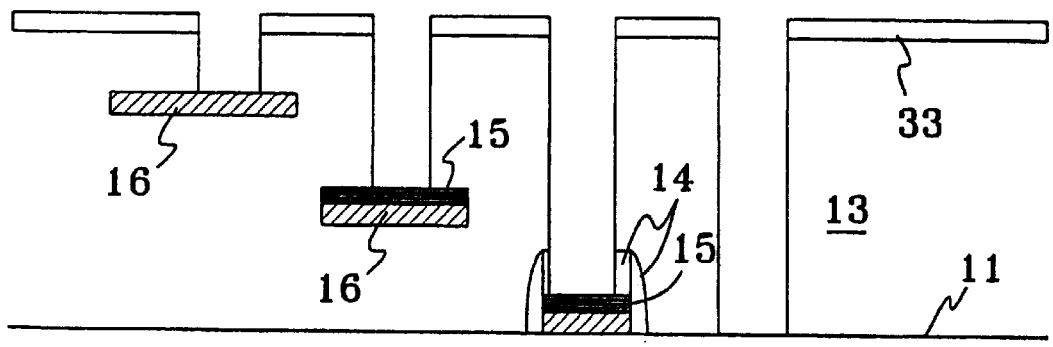
Figure 4D:
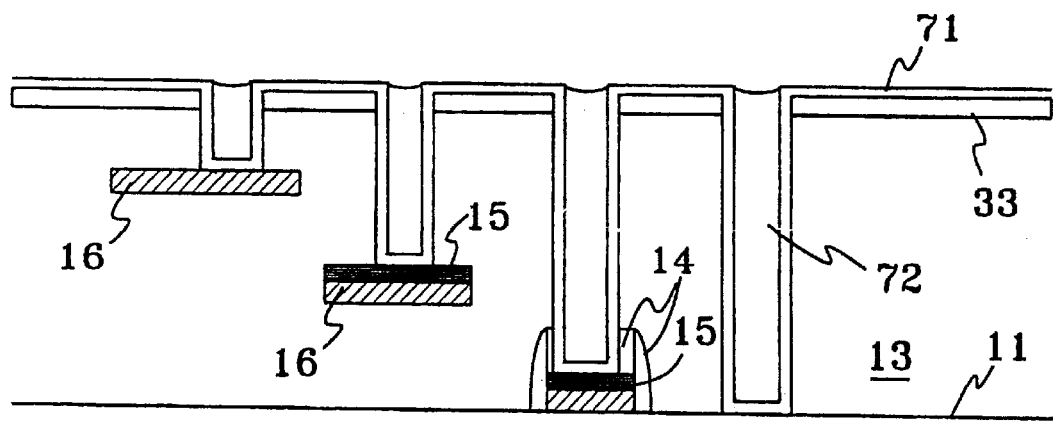
Figure 4E:
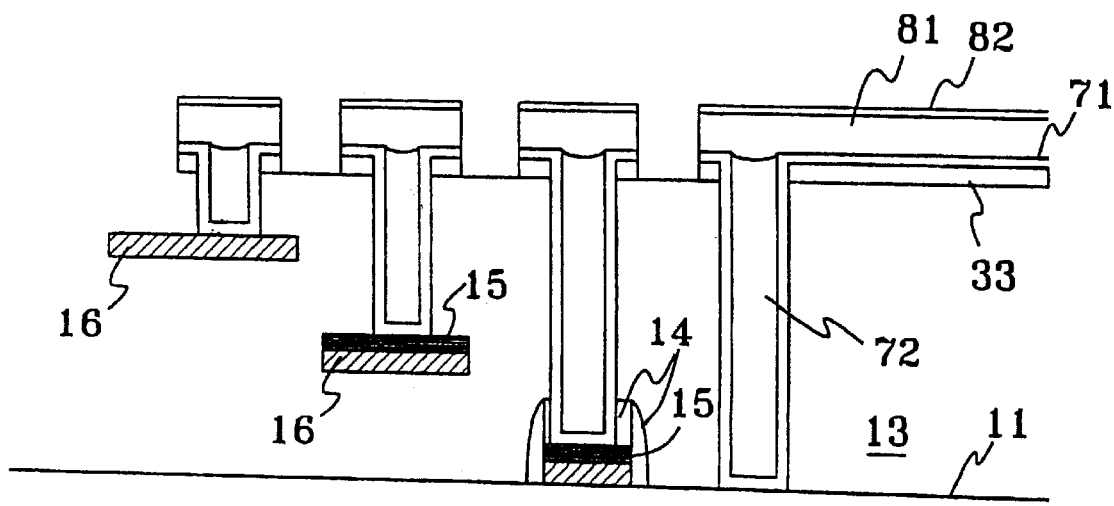

Then, the photoresist 12 and the anti-reflective coating 32 are removed by 1% to 25% of $CF_4$, 1% to 80% of Ar, 1% to 25% of $CHF_3$, or 1% to 35% of $O_2$ chemistry etching under a pressure of 1.0 millitorr to 200 millitorr, as shown in FIG. 4c. The step of etching stops at the reflective coating 33. A metallization process is then proceeded. In FIG. 4d, a barrier metal 71 and tungsten 72 are deposited to produce tungsten plugs. Finally, in FIG. 4e, a metal layer 81 and titanium nitride 82 are deposited and patterned. In which the metal layer 81 can be an alloy of aluminum and copper, or copper metal.

By the method for producing multi-level contacts of the present invention, disadvantages including light interference and etching variations of the prior art can be overcome. Production process can be effectively controlled. The present invention helps to advance processes towards smaller devices.

The features and effects of this invention have been described in terms of the preferred embodiments and particular Applications. It will be appreciated that various substitutions in form may be made by those skilled in the art without departing from the spit of the invention.

What is claimed is:

1. A method for producing multi-level contacts, comprising the steps of:
    (a) providing a dielectric layer on a substrate which has a plurality of devices formed at various levels above the substrate;
    (b) forming a reflective coating on the dielectric layer;
    (c) forming an anti-reflective coating on the reflective coating; and
    (d) etching the dielectric layer and forming a plurality of contacts, wherein the reflective coating and the anti-reflective coating serve as etching hard masks and bottoms of the plurality of contacts respectively reach the plurality of devices.

2. The method of claim 1, wherein the reflective coating is selected from the group consisting of titanium and titanium nitride.

3. The method for producing multi-level contacts of claim 1, wherein the anti-reflective coating is silicon oxynitride.

4. A method for producing semiconducting devices, comprising the steps of:
    (a) forming a plurality of devices at various levels on a substrate;
    (b) forming a reflective coating of titanium component and an anti-reflective coating of silicon oxynitride on the substrate; and
    (c) etching the reflective coating and the anti-reflective coating to form a plurality of multi-level contacts on the substrate, wherein the reflective coating and the anti-reflective coating serve as etching hard masks and bottoms of the plurality of contacts respectively reach the plurality of devices.

5. The method of claim 1, further comprising:
    performing a metallization process to the contacts to form electrical connections to the plurality of devices, whereby residual reflective coating is etched.

6. The method of claim 5, wherein performing the metallization process further comprises:
    depositing a barrier metal layer over the residual reflective coating and contacts to the plurality of devices;
    depositing a tungsten plug within each barrier metal layer coated contact;
    depositing a patterned metal layer over the barrier metal layer and tungsten plugs; and
    depositing a patterned titanium compound layer over the patterned metal layer.

7. The method of claim 4, further comprising:
    performing a metallization process to the multi-level contacts to form electrical connections to the plurality of devices, whereby residual reflective coating is etched.

8. The method of claim 7, wherein performing the metallization process further comprises:
    depositing a barrier metal layer over the residual reflective coating and multi-level contacts to the plurality of devices;
    depositing a tungsten plug within each barrier metal layer coated contact;
    depositing a patterned metal layer over the barrier metal layer and tungsten plugs; and
    depositing a patterned titanium compound layer over the patterned metal layer.

* * * * *